(12) United States Patent
Rohilla

(10) Patent No.: US 7,659,776 B2
(45) Date of Patent: Feb. 9, 2010

(54) OFFSET VOLTAGE CORRECTION FOR HIGH GAIN AMPLIFIER

(75) Inventor: Gajender Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 73 days.

(21) Appl. No.: 11/636,347

(22) Filed: Dec. 6, 2006

(65) Prior Publication Data

US 2008/0088368 A1   Apr. 17, 2008

(30) Foreign Application Priority Data

Oct. 17, 2006   (IN)   ............ 1912/CHE/2006

(51) Int. Cl.
*H03F 1/02*   (2006.01)
(52) U.S. Cl. .......................... 330/9; 330/308
(58) Field of Classification Search ............ 330/9, 330/308; 250/214 A, 214 AG
See application file for complete search history.

(56) References Cited

U.S. PATENT DOCUMENTS

| | | |
|---|---|---|
| 4,563,656 A | 1/1986 | Baum |
| 4,709,370 A | 11/1987 | Bednarz et al. |
| 5,132,553 A | 7/1992 | Siegel |
| 5,307,145 A * | 4/1994 | Schenkel et al. ............ 356/215 |
| 5,532,471 A | 7/1996 | Khorramabadi et al. |
| 5,561,288 A | 10/1996 | Stevens |
| 5,570,221 A | 10/1996 | Fujita |
| 5,734,300 A | 3/1998 | Yoder |
| 5,736,886 A | 4/1998 | Mangelsdorf et al. |
| 5,802,089 A | 9/1998 | Link |
| 5,812,030 A | 9/1998 | Inami et al. |
| 5,883,910 A | 3/1999 | Link |
| 5,892,609 A | 4/1999 | Saruwatari |
| 5,955,918 A | 9/1999 | Uno |
| 5,982,232 A | 11/1999 | Rogers |
| 5,990,737 A | 11/1999 | Czarnul et al. |
| 5,994,710 A | 11/1999 | Knee et al. |
| 6,005,413 A | 12/1999 | Schmitt |
| 6,018,257 A | 1/2000 | Hung et al. |
| 6,031,218 A | 2/2000 | Piot et al. |
| 6,130,556 A | 10/2000 | Schmitt et al. |
| 6,201,428 B1 | 3/2001 | Clark |
| 6,201,572 B1 | 3/2001 | Chou |
| 6,229,395 B1 | 5/2001 | Kay |
| 6,236,671 B1 | 5/2001 | Babic |

(Continued)

OTHER PUBLICATIONS

Kevin W. Kobayashi, "State-of-the-Art 60 GHz, 3.6 K-Ohm Transimpedance Amplifier for 40 Gb/s and Beyond", Radio Frequency Integrated Circuits (RFIC) Symposium, 2003 IEEE, Publication Date: Jun. 8-10, 2003, pp. 55-58.

(Continued)

*Primary Examiner*—Robert Pascal
*Assistant Examiner*—Hieu P Nguyen

(57) ABSTRACT

A method and an apparatus are described for an offset correction in a high gain amplifier. An embodiment of an amplifier circuit includes an amplifier to convert a current signal into a voltage signal, where the amplifier generates an offset voltage in the voltage signal. The amplifier circuit also includes a sampling component coupled with the amplifier, with the sampling component subtracting a first sample of the voltage signal from a second sample of the voltage signal to produce a difference value. The amplifier circuit further includes a gain component coupled with the sampling component to amplify the difference between the first sample and the second sample.

17 Claims, 5 Drawing Sheets

U.S. PATENT DOCUMENTS

| | | | |
|---|---|---|---|
| 6,243,134 | B1 | 6/2001 | Beiley |
| 6,246,282 | B1 | 6/2001 | Oono et al. |
| 6,272,160 | B1 | 8/2001 | Stronczer |
| 6,300,800 | B1 | 10/2001 | Schmitt et al. |
| 6,303,922 | B1 | 10/2001 | Kasper |
| 6,323,734 | B1 | 11/2001 | Henrion et al. |
| 6,384,401 | B1 * | 5/2002 | Jensen .................. 250/214 R |
| 6,424,407 | B1 | 7/2002 | Kinrot et al. |
| 6,585,158 | B2 | 7/2003 | Norskog |
| 6,618,406 | B1 | 9/2003 | Kaminishi |
| 6,753,851 | B2 | 6/2004 | Choi et al. |
| 6,795,056 | B2 | 9/2004 | Norskog et al. |
| 6,803,555 | B1 * | 10/2004 | Parrish et al. ........... 250/214 C |
| 6,823,077 | B2 | 11/2004 | Dietz et al. |
| 6,842,320 | B1 | 1/2005 | Mathur et al. |
| 6,933,786 | B1 | 8/2005 | Mohandas et al. |
| 6,980,575 | B1 | 12/2005 | Rohilla |
| 7,250,893 | B2 * | 7/2007 | Todoroff et al. ............. 341/155 |
| 7,253,837 | B2 | 8/2007 | Henderson et al. |
| 7,268,338 | B2 * | 9/2007 | Liu et al. ............. 250/214 AG |
| 7,279,668 | B2 | 10/2007 | Misek |
| 7,280,140 | B2 | 10/2007 | Henderson |
| 7,326,904 | B2 | 2/2008 | Fussum |
| 7,443,427 | B2 | 10/2008 | Takayanagi |
| 2002/0110167 | A1 | 8/2002 | Patterson, III |
| 2005/0285960 | A1 | 12/2005 | Purcell et al. |

OTHER PUBLICATIONS

Yong-Hun Oh et al., "A 2.5Gb/s CMOS Transimpedance Amplifier Using Novel Active Inductor Load", Solid-State Circuits Conference, 2001, ESSCIRC 2001, Proceedings of the 27th European. Publication Date: Sep. 18-20, 2001, pp. 178-181.

Mihai A.T. Sanduleanu et al., "A Low Noise, Wide Dynamic Range, Transimpedance Amplifier with Automatic Gain Control for SDH/SONET (STM16/OC48) in a 30GHz $f_T$ BiCMOS Process", Solid-State Circuits Conference, 2001, ESSCIRC 2001, Proceedings of the 27th European. Publication Date: Sep. 18-20, 2001, pp. 190-193.

Hewlet-Packard Components Group, "Noise Sources in CMOS Image Sensors", *Imaging Products Operations*, (Jan. 4, 1998), 2 pages.

USPTO Notice of Allowance for U.S. Appl. No. 11/271,039 dated Jun. 5, 2007: 7 pages.

USPTO Final Rejection for U.S. Appl. No. 11/271,039 dated Mar. 16, 2007; 8 pages.

USPTO Non-Final Rejection for U.S. Appl. No. 11/271,039 dated Aug. 08, 2006; 7 pages.

U.S. Appl. No. 11/271,039: "Signal Processing Circuit and Method for Use with an Optical Navigation System," Todoroff et al.; filed on Nov. 12, 2005; 23 pages.

USPTO Notice of Allowance for U.S. Appl. No. 10/256,680 dated Aug. 23, 2004; 5 pages.

USPTO Final Rejection for U.S. Appl. No. 10/256,680 dated Jun. 3, 2004; 9 pages.

USPTO Non-Final Rejection for U.S. Appl. No. 10/256,680 dated Dec. 3, 2003; 8 pages.

U.S. Appl. No. 10/256,680: "Hot-Pluggable Over-Voltage Tolerant Input/Output Circuit," Mathur et al.; Sep. 23, 2002; 37 pages.

USPTO Notice of Allowance for U.S. Appl. No. 09/515,549 dated Jul. 15, 2001; 3 pages.

USPTO Non-Final Rejection for U.S. Appl. No. 09/515,549 dated Jan. 26, 2001; 7 pages.

U.S. Appl. No. 09/515,549: "Trans-Impedance Amplifier," Henrion et al.; Feb. 29, 2000; 19 pages.

USPTO Notice of Allowance for U.S. Appl. No. 09/801,409 dated Jun. 20, 2005; 7 pages.

USPTO Non-Final Rejection for U.S. Appl. No. 09/801,409 dated Mar. 17, 2005; 9 pages.

USPTO Non-Final Rejection for U.S. Appl. No. 09/801,409 dated Oct. 20, 2004; 8 pages.

USPTO Non-Final Rejection for U.S. Appl. No. 09/801,409 dated Apr. 27, 2004: 8 pages.

USPTO Non-Final Rejection for U.S. Appl. No. 09/801,409 dated Oct. 22, 2003: 7 pages.

USPTO Non-Final Rejection for U.S. Appl. No. 09/801,409 dated Apr. 23, 2003; 5 pages.

USPTO Non-Final Rejection for U.S. Appl. No. 09/801,409 dated Nov. 8, 2002; 7 pages.

U.S. Appl. No. 09/801,409: "New Topology on VCSEL Driver," Gajender Rohilla; filed on Mar. 8, 2001; 14 pages.

Maxim, "MAX3261 - Single +V, Fully Integrated, 1.25Gbps Laser Diode Driver," Maxim Integrated Products, 2000; 2 pages.

USPTO Notice of Allowance for U.S. Appl. No. 10/146,524 dated Mar. 28, 2005; 4 pages.

USPTO Advisory Action for U.S. Appl. No. 10/146,524 dated Nov. 26, 2004; 2 pages.

USPTO Final Rejection for U.S. Appl. No. 10/146,524 dated Sep. 14, 2004; 4 pages.

USPTO Non-Final Rejection for U.S. Appl. No. 10/146,524 dated Apr. 20, 2004; 4 pages.

USPTO Advisory Action for U.S. Appl. No. 10/146,524 dated Feb. 24, 2004; 2 pages.

USPTO Final Rejection for U.S. Appl. No. 10/146,524 dated Dec. 11, 2003; 5 pages.

USPTO Non-Final Rejection for U.S. Appl. No. 10/146,524 dated Jul. 17, 2003; 6 pages.

U.S. Appl. No. 10/146,524: "Amplifier Circuit and Method," Mohandas et al.; filed on May 15, 2002; 15 pages.

Khorramabadi et al., "A 1.06Gb/s -32Bm to 0dBm BiCMOS Optical Preamplifier Featuring Adaptive Transimpedance," ISSCD95/SESSION 3/ANALOG TECHNIQUES/ PAPER WP3.4, 1995; 5 pages.

Meyer et al., "A Wideband Low-Noise Variable-Gain BiCMOS Transimpedance Amplifier," IEEE Journal of Solid-State Circuits, vol. 29, No. 6, Jun. 1994, pp. 701-706; 6 pages.

van den Broeke et al., "Wide-Band Integrated Optical Receiver with Improved Dynamic Range Using a Current Switch at the Input," IEEE Journal of Solid-State Circuits, vol. 28, No. 7, Jul. 1993, pp. 862-864; 3 pages.

Phang et al., "A CMOS Optical Preamplifier for Wireless Infrared Communications," IEEE Transactions on Circuits and Systems-II: Analog and Digital Signal Processing, vol. 46, No. 7, Jul. 1999, pp. 852-859; 8 pages.

Chien et al., "Bandwidth Enhancement of Transimpedance Amplifier by a Capacitive-Peaking Design," IEEE Journal of Solid-State Circuits, vol. 34, No. 8, Aug. 1999, pp. 1167-1170; 4 pages.

* cited by examiner

OFFSET VOLTAGE CORRECTION FOR HIGH GAIN AMPLIFIER

FIELD OF THE INVENTION

The invention relates generally to electronic circuits. More particularly, the invention relates to an offset voltage correction for a high gain amplifier.

BACKGROUND

In the operation of certain amplifiers, an offset voltage may be introduced into the output. If the input signal is very small, then the offset may be much larger than the actual signal. For example, a photodiode will generally produce a very low current. A transimpedance amplifier (TIA) may be used convert the current generated by incident into an output voltage signal. The transimpedance amplifier may be realized through use of a switch capacitor based integrator.

However, a switch based capacitor integrator may add an undesirable supply dependent offset voltage to the output of the amplifier. In this example, the offset is caused by a charge injection from the switch of the integrator circuit. Because the amplifier requires a large gain, a very small capacitor is used, and thus results in a relatively high offset voltage as the capacitor is discharged.

In a system, the offset voltage will generally be subject to further amplification, such by a succeeding programmable gain stage. At higher gain values, the output of the programmable gain stage output offset may include a significant offset voltage.

Even if an offset voltage may then be reduced or eliminated, the voltage generally has introduced non-linearities into the signal, thereby distorting the signal output. Further, the amplified offset voltage may effectively reduce the dynamic range of circuit elements, such as an analog to digital converter element, because of the need to convert a signal that includes a large offset voltage component into a digital value, rather than only converting the smaller value of the actual output signal.

BRIEF DESCRIPTION OF THE DRAWINGS

The present invention is illustrated by way of example, and not by way of limitation, in the figures of the accompanying drawings in which like reference numerals refer to similar elements, and in which.

DETAILED DESCRIPTION

Figure 1:
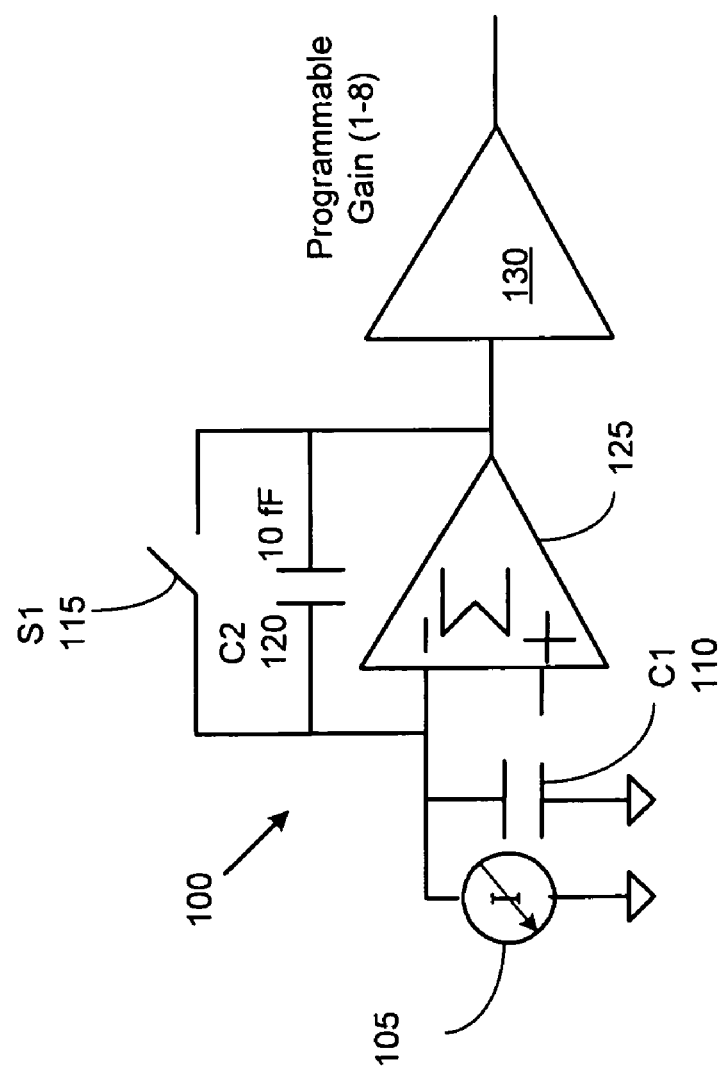
FIG. 1 is an illustration of a transimpedance amplifier circuit.

An embodiment of the present invention provides offset correction for a high gain amplifier.

In one embodiment of the invention, an offset voltage introduced by a high gain amplifier is countered prior to amplification of the signal. The high gain amplifier may be a transimpedance amplifier used to convert a current signal into a voltage output. In an embodiment of the invention, the offset voltage is reduced through a double sampling process in which the sample voltages taken from the amplifier output are subtracted from each other.

For example, a photodiode array may be used to convert incident light into current. Among other uses, the photodiode array may be used to generate a signal based on the received light. In the operation of a device such as a photodiode, a very small current is produced. The current that is produced is expected to be in the range of 5 pA (picoamps) up to 200 pA. In such a circuit, a transimpedance amplifier is used to convert the resulting input current to an output voltage.

The operation of the transimpedance amplifier generally includes an integration operation, such as by the use of a switched capacitor integrator. A switched capacitor integrator normally operates by periodically switching a potential onto a switching capacitor in a sampling, or charging, phase and then transferring the charge. In a common operation, the charge of the switching capacitor is transferred at the summing node of an operational amplifier. The operational amplifier then drives the integrator output to produce the signal output.

However, in an operation of a high gain amplifier, the capacitor components are generally very small in size in order to provide for a high gain. As a consequence of the use of the small value capacitor, a charge injection will be created by the switch operation. The charge injection is dependent on the supply voltage present and the circuit components, including in particular the size of the charging capacitor. The charge injection will often result in the creation of a significant offset voltage in the output signal.

If an offset voltage is created in a signal for a high gain amplifier, the offset voltage may overwhelm the actual signal voltage. As a result, even if the offset voltage is significantly reduced, the system may produce a non-linear output, and may be required to handle a much higher voltage that is necessary, thus reducing the dynamic range capacity of the system components. In one possible example, an offset voltage of +/− 40 mv produced by a transimpedance amplifier then translates to +/− 320 mv at the output of a gain block that is providing a programmable gain of 8. This effectively reduces the dynamic range of the ADC component by 640 mv. The resulting output will also be nonlinear due to the large voltage offset.

In an embodiment of the invention, a high gain amplifier circuit counters an offset voltage prior to amplification, thereby reduces the effects of the offset voltage. In an embodiment, a circuit provides for a doubling sampling for the amplifier integrator, with one sample voltage potential being subtracted from the other. In an embodiment of the invention, the subtraction of the samples occurs as analog voltage values prior to conversion of such values to digital values.

FIG. 1 is an illustration of a transimpedance amplifier (TIA) circuit. In this illustration, a TIA circuit 100 is intended to generate a voltage signal output from a current signal input. In one example, the TIA 100 requires a high gain because the current input signal is very small. The input device is shown as variable current source 105, which may produce a very small current signal, together with the capacitance C1 110 of the device. The input device may be, for example, a photodiode, but embodiments of the invention are not limited to circuits receiving signals from such devices. The TIA circuit 100 may be constructed using a switch capacitor base integrator, as represented by switch S1 115. The switch is generally implemented as a MOS (metal oxide semiconductor)

device providing a gate to the power supply. The TIA 100 requires a high gain due to the small input, and thus the TIA 100 includes a switching capacitor C2 100 with a very small capacitance, such as, for example, a capacitance in the range of 10 fF (femifarads). As illustrated, the TIA circuit 100 further includes an amplifying unit 125, illustrated as an operational amplifier (opamp).

However, the switch S1 115 creates a charge injection to the operational amplifier 125, thus creating an offset voltage with a potential that is dependent on the components, including any parasitic capacitance, and on the supply voltage (which is not shown in this illustration). The offset voltage will be large in comparison with the output signal. In this illustration, the output signal is then presented to a gain stage 130, which may be, for example, a programmable gain stage providing a gain from 1 to 8, as set depending on the system requirements. The offset voltage thus will be amplified by the gain stage 130, thereby increasing the effects caused by this signal component.

In an embodiment of the invention, the offset voltage is corrected to reduce the impact of the unwanted voltage. In an embodiment of the invention, the offset voltage is corrected prior to the operation of a gain stage, such as illustrated gain stage 130, thereby further reducing the impact of such voltage potential. In an embodiment of the invention, the offset correction is implemented by sampling the signal at two different times, with one sample voltage being subtracted from the other sample voltage to reduce or eliminate the offset voltage component.

Figure 2:
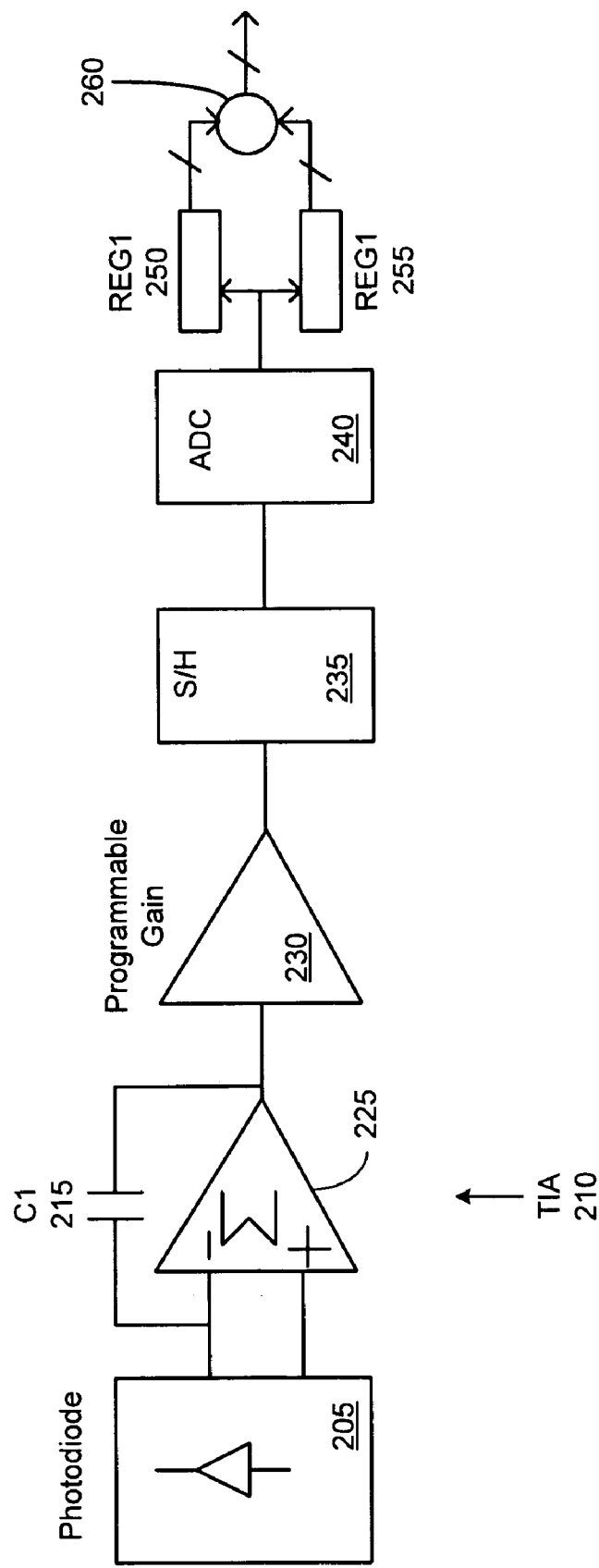
FIG. 2 is an illustration of a circuit to counter an offset voltage in a high gain amplifier.

FIG. 2 is an illustration of a circuit to counter an offset voltage in a high gain amplifier. In this figure, the output of a photodiode 205 is presented to a TIA 210, illustrated as a switching capacitor C1 215 and switch S1 220 across an operational amplifier 225. The output of the TIA 210 is then provided to a programmable gain stage 230. The amplified signal from the gain stage is provided to a sample and hold device 235, which samples the signal and holds it for use by an analog to digital converter (ADC) 240.

In order to counter the effect of the offset voltage generated by the TIA 210, two samples are taken by the sample and hold device at different times to offset against each other. As illustrated, the output of the ADC is provided to a first register REG1 250 and to a second register REG2 255. The value of one register is subtracted from the other register by a subtractor 260, which acts to counter the offset voltage. The subtraction operation thus occurs as an operation on digital values.

However, the circuit operates by the ADC double sampling the signal and removing the offset in the output. In order to accomplish this, the ADC 235 is required to work at higher rate in order to accommodate two samples in each time period. Further, at higher gains in the programmable gain state the output offset becomes significantly large. For example, a +/− 40 mV offset in the TIA 210 will translate to a +/− 320 mV offset at the output of the gain stage for an 8× gain. This results in a reduction in the dynamic range of the ADC by 640 mV. The offset voltage also introduces a non-linearity in the signal output.

In an embodiment of the invention, the amplification of the offset voltage is prevented by shifting the process of countering the voltage offset to the gain stage. In an embodiment of the invention, the elimination of offset voltages assists in preserving the dynamic range of the analog to digital converter and assists in maintaining the linearity of the output of amplifier circuit.

Figure 3:
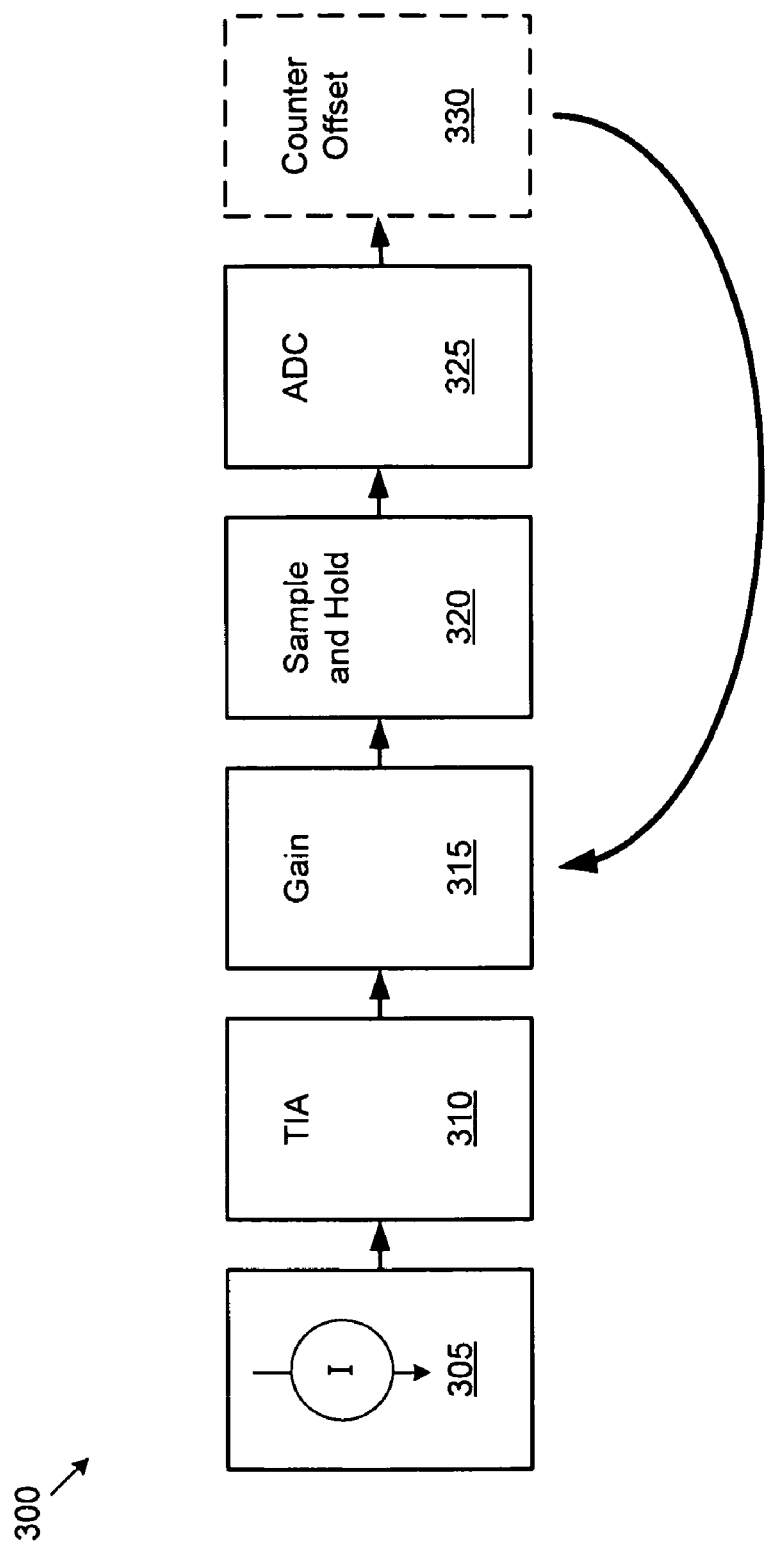
FIG. 3 is an illustration of an embodiment of a system for removing offset voltage from a high gain amplifier circuit.

FIG. 3 is an illustration of an embodiment of a system for removing offset voltage from a high gain amplifier circuit. In this illustration, a high gain amplifier circuit 300 receives a small signal from a current source 305. The signal is received by an amplifier 310, such as a TIA, that provides a high gain to amplify the signal to a manageable level. However, the high gain amplifier injects a significant offset voltage into the signal output. If the signal output is then presented to a gain stage 315, this causes a significant increase in the offset voltage. The gain stage is followed by a sample and hold stage 320 and an analog to digital conversion 325. If the offset is countered after the conversion process 330, as in a double sampling process in which the two samples are compared to eliminate the offset element, then there are certain drawbacks in operation, as described with regard to FIG. 2.

In an embodiment of the invention, the process of countering the offset voltage is 330 is transferred to the gain stage 315 of the amplifier circuit. In an embodiment of the invention, the offset is made in the analog operation before conversion of signals to digital format. The offset is corrected prior to the gain operation, thus improving the performance of the system. In an embodiment of the invention, a combined correction and gain stage is implemented, thereby countering the effects of the offset voltage while also operating to maintain linearity of the output.

Figures 4A, 4B:
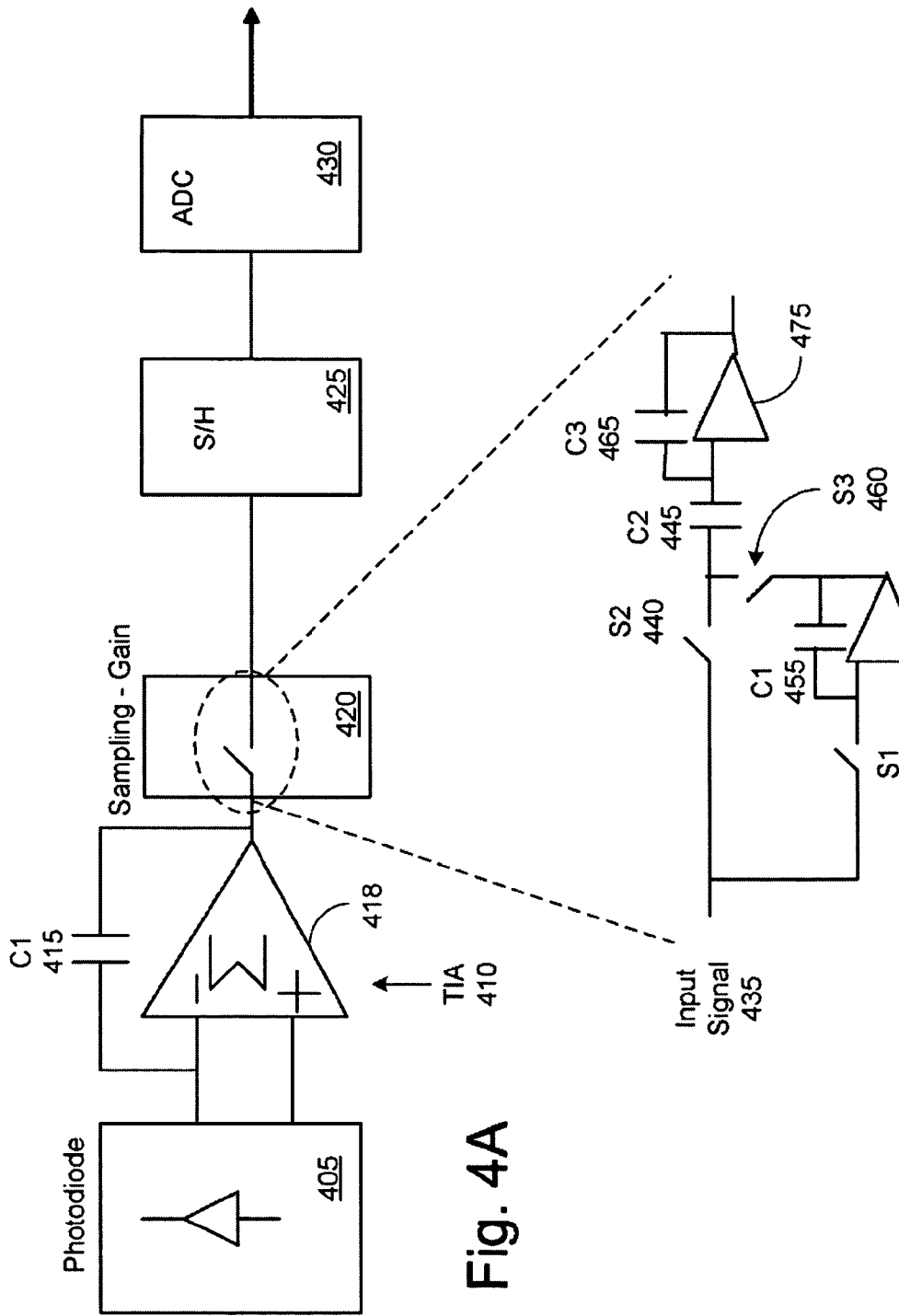
FIG. 4A is an illustration of an embodiment of an amplifier circuit with correlated sampling and gain
FIG. 4B is an illustration of an embodiment of a sampling and gain stage for an amplifier circuit.

FIG. 4A is an illustration of an embodiment of an amplifier circuit with correlated sampling and gain. The illustrated schematic is intended to illustrate the major elements of the amplifier circuit, and does not contain every element or connection. In this illustration, an amplifier circuit may amplify a signal produced by a small current source, including, but not limited to, a photodiode 405. The current signal produced by the photodiode 405 is presented to a TIA 410, which converts the small current signal into a voltage signal of sufficient magnitude for operation. The TIA is shown as a sampling capacitor C1 415 coupled across an operational amplifier 418. In an embodiment of the invention, the TIA 410 is integrated via operation of a sampling and gain stage 420. The components of the sampling and gain stage 420 operate using a double sampling process that removes an offset voltage from the output of the TIA 410. The sampled output is then transferred to a sample and hold stage 425 to hold the signal values for conversion into digital values by the analog to digital converter 430.

In an embodiment of the invention, the amplifier circuit provides for operation to counter the offset voltage prior to the gain stage, thus preventing the amplification of the offset voltage potential. Further, the process is implemented prior to conversion of the signal into digital values, and thus the ADC is not required to operate at a higher rate to handle the double samples.

FIG. 4B then is an illustration of an embodiment of a sampling and gain stage for an amplifier circuit. In this illustration, a sampling and gain stage, such as the sampling and gain stage 420 shown in FIG. 4A, receives an input signal 435 from a previous stage. The input signal 435 is the result of the conversion of a current signal from a device that, for example, produces a very small current and thus requires a large amount of amplification in a TIA stage. The sampling and gain stage includes multiple switches that operate to sample the received signal twice, and use such samples to remove the offset voltage from the signal. In an embodiment of the invention, the sample and gain stage includes a sampling component having a first switch S1 450 that operates to obtain a first sample from the input signal 435 at a first point in time, which sample is inverted by the capacitor C1 455 and operational amplifier 470, and a second switch S2 440 that operates to obtain a second sample of the input signal 435 at a second point in time, which is stored by the second capacitor C2 445. The value of the first sample is then effectively subtracted from the second sample by the operation of a third switch S3 460. In an embodiment of the invention, the values of the first and second samples are thus subjected to the subtraction via an analog operation using the two sample voltage potentials. The resulting difference voltage is then amplified by an amplifying subpart or component, as illustrated by a third capacitor C3 465 and a second op-amp 475. In an embodiment of the invention, the sample and gain stage samples the input signal 435 at the start and at the end of an integration process. In an embodiment of the invention, the illustrated stage operates to remove or reduce the offset voltage before the operation of the gain function. In an embodiment of the invention, the stage operations to improve the linearity and dynamic range of the analog to digital converter of an amplifier circuit.

Figure 5:
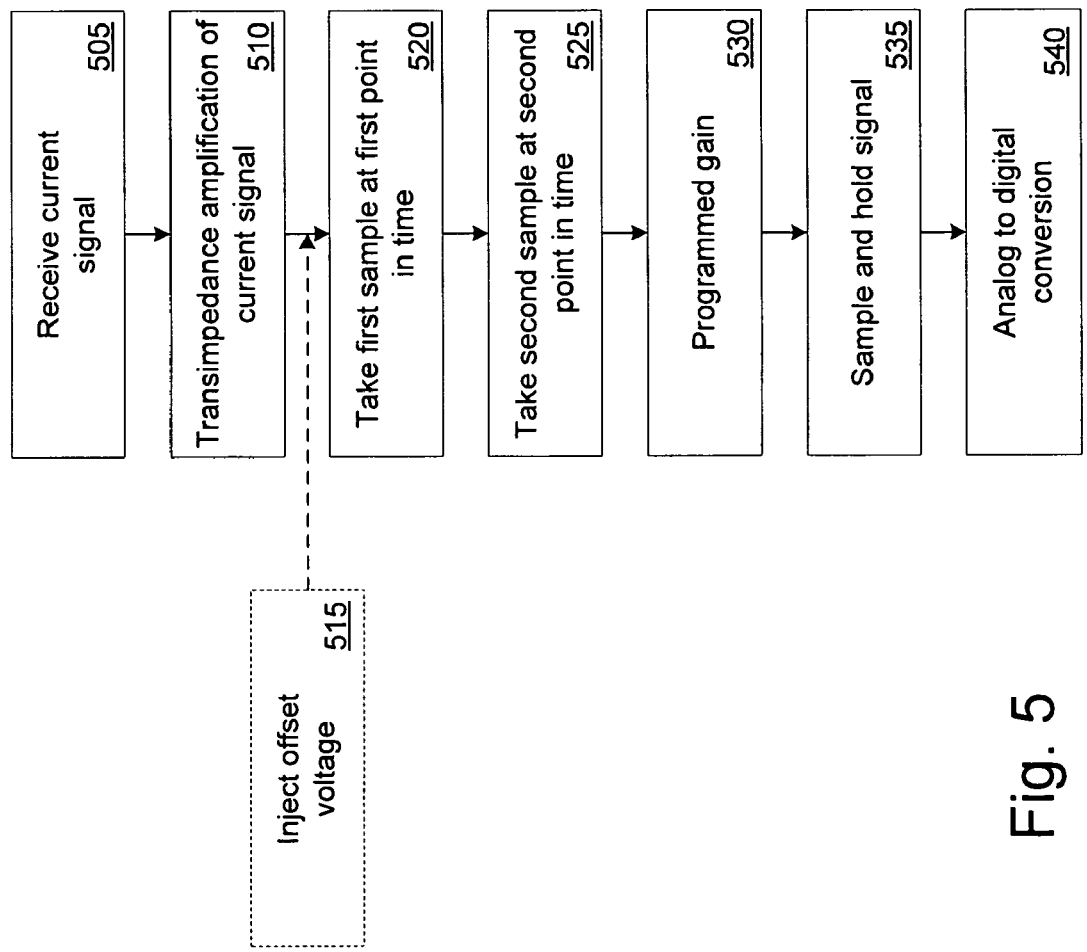
FIG. 5 is a flowchart to illustrate an embodiment of a method to counter an offset voltage in an amplifier.

FIG. 5 is a flowchart to illustrate an embodiment of a method to counter an offset voltage in an amplifier. As illustrated, a current signal is received 505, which is, for example, the small current produced by a photodiode. The current is subjected to transimpedance amplification 510, thereby producing a voltage signal. In this process, charge injection by the amplification process generates an offset voltage 5 15, with the offset voltage being dependent on the source voltage and the device components.

The transimpedance amplification is accomplished through switch integration in which multiple samples are taken of the signal. In an embodiment of the invention, a first sample is taken at a first point in time 520 and a second sample is taken at a second point in time 525. The first sample is subtracted from the second sample 530, which thus may be used to counter the offset voltage potential. In an embodiment of the invention, the subtraction operation is performed using the analog values of the first sample voltage potential and the second sample voltage potential.

The difference between the first sample value and the second sample may then be amplified by a programmed gain value 530, and the amplified signal value is obtained by a sample and hold stage 535. The output signal value is then converted to a digital value 540.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices may be shown in block diagram form.

The present invention includes various processes. Certain processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Methods herein may be described in their most basic form, but processes can be added to or deleted from any of the methods and information can be added or subtracted from any described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

What is claimed is:

1. An amplifier circuit comprising:
   an amplifier to convert a current signal into an analog voltage signal, the amplifier generating an offset voltage that is included in the voltage signal;
   a sampling stage, an input of the sampling stage being coupled with an output of the amplifier to receive the voltage signal, the sampling stage subtracting analog voltage values by subtracting a first sample of the voltage signal collected at a first time from a second sample of the voltage signal collected at a second time to generate a difference voltage to counter the offset voltage; and
   a gain stage, an input of the gain stage being coupled with an output of the sampling stage, the sampling stage to provide the difference voltage representing the difference between the first sample and the second sample to the gain stage, the gain stage to amplify the difference voltage.

2. The amplifier circuit of claim 1, wherein a source of the current signal is a photodiode.

3. The amplifier circuit of claim 1, wherein the amplifier includes a switching capacitor.

4. The amplifier circuit of claim 3, wherein charging the switching capacitor generates a charge injection that creates the offset voltage.

5. The amplifier circuit of claim 1, wherein the sampling stage subtracts the analog voltage values by connecting the voltage potential of the second sample to an inverted voltage potential of the first sample.

6. The amplifier circuit of claim 1, further comprising a sample and hold stage, an input of the sample and hold stage being coupled with an output of the gain stage to hold the amplified difference voltage signal.

7. The amplifier circuit of claim 6, farther comprising an analog to digital converter, an input of the analog to digital converter being coupled with an output of the sample and hold stage to convert the analog signal held by the sample and hold stage to a digital value.

8. A method to remove offset voltage comprising:
   converting a current signal into an analog voltage signal, the conversion of the signal injecting an offset voltage into the voltage signal;
   obtaining a first sample of the voltage signal at a first time and a second sample of the voltage signal at a second time, the voltage of the first sample being subtracted from the voltage of the second sample to generate an analog difference voltage to counter the offset voltage; and
   amplifying the difference voltage representing the difference between the first sample and the second sample.

9. The method of claim 8, wherein the subtraction of the first sample from the second sample reduces the offset voltage in the voltage signal.

10. The method of claim 8, further comprising sampling and holding the amplified difference voltage.

11. The method of claim 10, further comprising converting the sample of the difference voltage to a digital value.

12. The method of claim 8, wherein converting the current signal into a voltage signal comprises a switched capacitor integration of the current signal.

13. A method to remove offset voltage comprising:
converting a current signal into a voltage signal, the conversion of the signal injecting an offset voltage into the voltage signal;
obtaining a first sample and a second sample of the voltage signal, the voltage of the first sample being subtracted from the voltage of the second sample to counter the offset voltage; and
amplifying a difference between the first sample and the second sample, wherein the subtraction of the first sample from the second sample is performed by connecting the voltage potential of the second sample to an inverted voltage potential of the first sample.

14. The method of claim 13, wherein the subtraction of the first sample from the second sample reduces the offset voltage in the voltage signal.

15. The method of claim 13, comprising sampling and holding the amplified difference between the first sample and the second sample.

16. The method of claim 15, further comprising converting the sample of the difference between the first sample and the second sample to a digital value.

17. The method of claim 13, wherein converting the current signal into a voltage signal comprises a switched capacitor integration of the current signal.

* * * * *